(12) United States Patent
Marazzi et al.

(10) Patent No.: US 6,766,072 B2
(45) Date of Patent: Jul. 20, 2004

(54) OPTICAL THRESHOLD AND COMPARISON DEVICES AND METHODS

(75) Inventors: Lucia Marazzi, Pavia (IT); Mario Martinelli, San Donato Milanese (IT); Paola Parolari, Milan (IT)

(73) Assignee: Pirelli Cavi E Sistemi S.p.A., Milan (IT)

(*) Notice: Subject to any disclaimer, the term of this patent is extended or adjusted under 35 U.S.C. 154(b) by 76 days.

(21) Appl. No.: 09/915,401

(22) Filed: Jul. 27, 2001

(65) Prior Publication Data

US 2002/0044709 A1 Apr. 18, 2002

Related U.S. Application Data

(60) Provisional application No. 60/223,477, filed on Aug. 7, 2000.

(30) Foreign Application Priority Data

Jul. 28, 2000 (EP) .......................................... 00306465

(51) Int. Cl.[7] ................................................. G02B 6/12
(52) U.S. Cl. ..................... 385/14; 250/227.21; 359/344
(58) Field of Search ................................ 359/344, 349, 359/107; 250/227.19, 227.21, 227.27; 385/14

(56) References Cited

U.S. PATENT DOCUMENTS

| | | | |
|---|---|---|---|
| 4,748,630 A | 5/1988 | Nagashima | ..................... 372/8 |
| 5,537,243 A | 7/1996 | Fatehi et al. | ................. 359/541 |
| 5,999,284 A | 12/1999 | Roberts | ....................... 359/108 |
| 6,091,540 A | * 7/2000 | Nakano | ..................... 359/341.3 |

FOREIGN PATENT DOCUMENTS

EP  0 974 888 A1  1/2000

OTHER PUBLICATIONS

Vanderhaegen, B. et al., "Experimental Characteristics of an All–Optical 2R Regenerator with Adjustable Decision Treshold", 1999 IEEE LEOS Annual Meeting Conference Proceedings, vol. 2, p. 902–903, (1999).
Parolari, P. et al., "SOA Based All–Optical Threshold", Optical Society of America, p. 309–310, (1999).
Gray, R. W. et al., "Optooptic Modulation Based on Gain Saturation", IEEE Journal of Quantum Electronics, vol., QE–14, No. 11, p. 893–900, (1978).

(List continued on next page.)

*Primary Examiner*—Mark A. Robinson
*Assistant Examiner*—Alessandro Amari
(74) *Attorney, Agent, or Firm*—Finnegan, Henderson, Farabow, Garrett & Dunner, L.L.P.

(57) ABSTRACT

An optical device for providing threshold and comparison functions. The device comprises first and second SOA's having respective first and second propagation paths along which the first and second optical signals, input as signals $P_{in1}(\lambda_1)$ and $P_{in2}(\lambda_2)$ travel in first and second forward directions. A feedback path is provided using couplers to interconnect the outputs of the SOA's. As a result, a portion of the optical signals output from each SOA is supplied backwards into the output of the other SOA as feedback optical control signals $P_{feedback1}(\lambda_1)$ and $P_{feedback2}(\lambda^2)$. The feedback optical control signals modulate the gain of the forwards travelling optical signals by cross gain modulation (XGM). In contrast to prior art devices, the optical control signal is supplied backwards into the SOA's in a counter-propagating configuration. This allows much shorter feedback path lengths to be achieved in comparison to what is possible with prior art co-propagating configurations. Consequently, much higher bit rates can be achieved. The device may also be implemented in planar waveguide technology.

21 Claims, 4 Drawing Sheets

OTHER PUBLICATIONS

Fatehi, M. T. et al., "Erbium–Doped Fiber Amplifiers with Wavelength–Selective Optical Feedback", IEEE Photonics Technology Letters, vol. 8, No. 8, p. 1012–1014, (1996).

Poustie, A. J. et al., "Temporal Evolution of Amplitude Restoration and Thresholding in an All–Optical Regenerative Memory", Journal of Modern Optics, vol. 46, No. 8, p. 1251–1254, (1999).

Morthier, G. et al., "A Novel Optical Decision Circuit Based on Mach–Zehnder or Michelson Interferometer and Gain–Clamped Semiconductor Optical Amplifiers", IEEE Photonics Technology Letters, vol. 10, No. 3, p. 1162–1164, (1998).

* cited by examiner

PRIOR ART

OPTICAL THRESHOLD AND COMPARISON DEVICES AND METHODS

This application claims the benefit of Provisional Application No. 60/223,477, filed Aug. 7, 2000.

BACKGROUND OF THE INVENTION

The invention relates to optical devices and methods for optical threshold determination and for performing comparison functions, as are used in signal regeneration, pattern recognition and optical computing applications.

FIG. 1 of the accompanying drawings shows an optical device as proposed by Gray et al [1]. The proposed device is an amplifier made of an active gain medium such as a rod used for a solid state laser. In operation, one signal $I_1$ is injected straight through the gain medium and another signal $I_2$ is injected in a zigzag path defined by total internal reflections from the sides of the gain medium. The zigzag path is longer than the straight path and thus has a higher net gain. Its output is thus more sensitive to variations in the gain of the gain medium than the output from the straight path. This allows a signal injected in the lower gain straight path to control the gain of a signal travelling in the zigzag path by cross saturation of the gain, i.e. cross gain modulation (XGM). Light input into the amplifier along the straight path thus represents a control input, whereas light input along the zigzag path represents a signal input to be modulated.

FIG. 2 of the accompanying drawings shows another optical device proposed by Gray et al [1] (see FIG. 10(a) of that reference) which is an optical differential comparator based on two of the above-described amplifiers connected in a feedback configuration. A portion of the signal output from a first amplifier 1 is fed back to the control input of a second amplifier 2 by means of a partially reflecting mirror 3 and further routing components 4 which may be a sequence of waveguides or mirrors. The feedback action results in operation analogous to that of an electrical differential amplifier or comparator, as illustrated in FIG. 10(b) of reference [1]. Threshold and logic functions are also discussed in reference [1].

FIG. 3 of the accompanying drawings shows a further prior art optical device according to Parolari et al [2]. This device may be considered to be a development of the free-space device of FIG. 2 proposed in reference [1]. The device comprises two amplifier elements 120 and 130 analogous to the corresponding elements 1 and 2 of FIG. 2. These are implemented as semiconductor optical amplifiers (SOA's). A portion of the output signal from the first SOA 120 is fed back to the input of the second SOA 130. Similarly, a portion of the output signal from the second SOA 130 is fed back to the input of the first SOA 120. Input and output side three-way couplers 123, 121, 133 and 131 ($C_{11}$, $C_{21}$, $C_{12}$ and $C_{22}$) are provided for this purpose, as illustrated.

In the prior art free-space device of FIG. 2, the two beams are separated spatially and thus do not interact. By moving to the waveguide implementation of FIG. 3, spatial separation is lost. To overcome this problem, spectral separation is provided by using two different wavelength $\lambda_1$, and $\lambda_2$ and inserting first and second optical filters 129 and 139 after their respective SOA's in order to separate the interacting signals. The first optical filter 129 is transmissive at the wavelength $\lambda_1$ of the first SOA 120 but absorptive at the wavelength $\lambda_2$ of the second SOA 130. This prevents the feedback signal $P_{feedback}(\lambda_2)$ being transmitted to the coupler 121 and on to the device output together with the output signal $P_{out}(\lambda_1)$. Similarly, the second optical filter 139 is transmissive at the wavelength $\lambda_2$ of the second SOA 130 but absorptive at the wavelength $\lambda_1$ of the first SOA 120. The filters 129 and 139 may be bandpass or cut-off filters. Bragg reflectors could be used, for example.

In addition, optical isolators 124 and 134 are inserted before both SOA's. This helps suppress problems arising from the use of SOA's as the non-linear active gain medium. These SOA problems may arise from: (a) the high small signal gain for unit length; (b) parasitic oscillations which may occur due to reflections in the circuit decrease the gain available for compression; and (c) the total device efficiency. Coupling ratios are chosen from a trade off between the feedback and output powers.

In summary, the device of FIG. 3 may be considered to be a waveguide development of the free-space device of FIG. 2 in which two wavelengths $\lambda_1$ and $\lambda_2$ are used instead of one, in conjunction with optical filters 129 and 139, and the isolators 124 and 134.

The maximum bit rates that can be handled by the prior art devices of reference [1] and reference [2] would be limited by the carrier lifetime in the active gain medium. In addition, the inventors have also realized that the maximum bit rates are also limited by the propagation time associated with the feedback paths. The propagation time is defined by the device topology and would limit the ultimate maximum speed of any such device, if the active gain medium response time is very short.

The XGM effect is also discussed by Fatehi et al [3] in relation to Erbium doped fiber amplifiers (EDFA's). Moreover, it has been proposed to exploit the related effect of cross phase modulation (XPM) in various interferometer devices [4][5][6].

SUMMARY OF THE INVENTION

According to a first aspect of the invention there is provided an optical device comprising:

(a) a first active medium having a first propagation path for traversal of a first optical signal in a first forward direction;

(b) a second active medium having a second propagation path for traversal of a second optical signal in a second forward direction; and (c) a feedback path connecting the first and second active media so as to route at least a portion of the first and second optical signals, after traversing the first and second active media, to the second and first active media as respective second and first optical control signals which travel along the second and first propagation paths in second and first reverse directions that are opposite to the second and first forward directions respectively.

According to a second aspect of the invention there is provided a method of modulating an optical signal, comprising:

(a) providing first and second active media;

(b) supplying first and second optical signals to traverse the first and second active media in first and second forward directions; and (c) routing at least a portion of the first and second optical signals, after traversing the first and second active media, to the second and first active media as second and first optical control signals respectively, wherein the first and second optical control signals are supplied through the first and second active media in first and second reverse directions opposed to the first and second forward directions so that the first and second optical control signals vary the modulation experienced by the first and second optical signals.

The device and method of the first and second aspects of the invention thus fundamentally differ from those of references [1] and [2] in that the optical control signal is supplied to the active medium in the opposite direction to the optical signal to be modulated, instead of in the same direction.

Whether the optical control signal is supplied in a co-propagating configuration, as in the prior art, or in the counter-propagating configuration according to the invention has little influence on the XGM effect. However, counter-propagation of the optical control signal means that separation of the optical signal and optical control signal can be obtained by the direction of propagation alone. Consequently, the optical signal and optical control signal can be the same wavelength if desired. Moreover, there is no requirement to separate out the optical control signal from the optical signal at the output, since it does not appear at the output, but rather at the input of the device, where it can be filtered out if desired by a conventional isolator, for example to suppress parasitic oscillations.

With the counter-propagating configuration, spatial filtering by use of different optical paths as in reference [1] is also not necessary. (This type of filtering would in any case be difficult for typical optical fiber or planar waveguide based devices). For the same reason, wavelength filtering is not necessary even when the optical control signal and optical signal share the same optical path. In other words, wavelength selective filters such as band pass or band reject filters are not needed.

The counter-propagating feedback configuration allows much shorter feedback path lengths to be achieved in comparison to what is possible with a co-propagating configuration. Consequently, much higher bit rates can be achieved, since the feedback time can be made commensurately shorter. It is estimated that the feedback path length can be made around 10 times shorter with the proposed counter-propagating configuration, than with a co-propagating configuration.

A device according to the first aspect of the invention may be implemented with optical fiber connections and fiber couplers. Alternatively, the device may be implemented as an integrated planar waveguide device using planar waveguide connection and Y-couplers. Free-space implementation could also be achieved, but this is not envisaged to be particularly interesting for most practical applications.

In an optical fiber implementation, the device has fewer components and lower losses than a comparable device having a co-propagating configuration. Moreover, the device will have a lower switching power, switching power being defined as the minimum input power needed to obtain a given extinction ratio.

In a planar waveguide implementation, the device will be much simpler to fabricate and bending losses can be significantly reduced, compared to a co-propagating device. In a co-propagating device, it is inevitable that the two feedback paths will need to cross, and this will add complexity to the fabrication in planar waveguide technology. By contrast, with the proposed counter-propagating feedback architecture, there is no such crossing to implement, the structure being inherently compatible with planar technology.

The proposed novel devices and methods based on counter-propagation of the optical control signals thus offer several major advantages which cannot be achieved with comparable co-propagating devices.

The device of the first aspect of the invention can operate as a threshold circuit for determining a threshold according to the method of the second aspect of the invention. Threshold determination has many applications.

For example, signal regeneration can be obtained by reshaping an optical signal which enters an optical decision circuit. All signal levels below a certain decision threshold are transformed into a constant low level, and all signal levels above the decision threshold are transformed into a constant high level.

Another application is in an all-optical pattern recognition device which needs a threshold to distinguish between auto-correlation values (when a target is recognized) and cross-correlation values (non-target sequences).

Moreover, comparison functions can also be employed in optical computing applications.

In one embodiment of the first aspect of the invention, the first and second active media are arranged so that their optical signal outputs face in the same direction. In other words, the first and second active media are arranged with their first and second forward directions aligned. The feedback path comprises a bend which is arcuate and passes through approximately 180 degrees.

In another embodiment of the first aspect of the invention, the first and second active media are arranged with their first and second forward directions opposed. The first and second output ports face towards each other. The feedback path is substantially straight, that is free of curvature liable to produce significant bending losses.

The active media of the first and second aspects of the invention may be gain media or lossy media so that the optical signals are amplified to varying degrees or attenuated to varying degrees depending on the optical control signals.

BRIEF DESCRIPTION OF THE DRAWINGS

For a better understanding of the invention and to show how the same may be carried into effect reference is now made by way of example to the accompanying drawings in which.

DETAILED DESCRIPTION

First Embodiment

Figure 1:
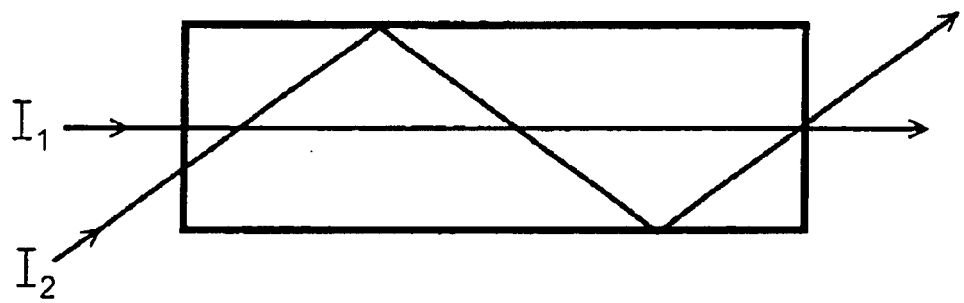
FIG. 1 shows a prior art cross-gain amplifier.
Figure 2:
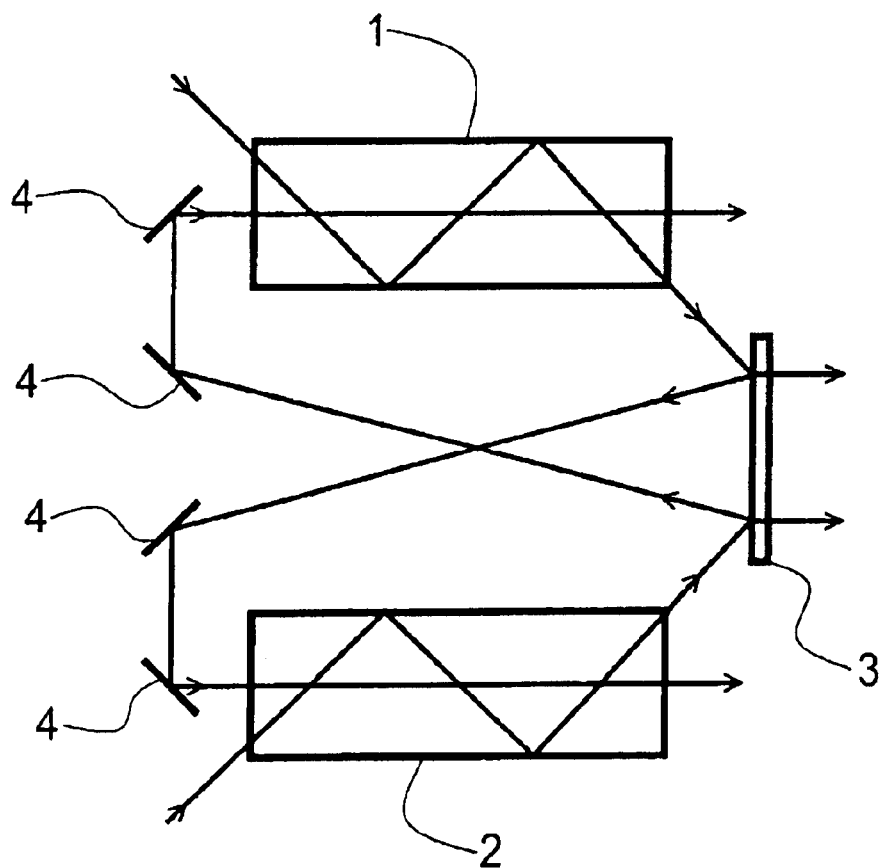
FIG. 2 shows a prior art optical device comprising two of the amplifiers of FIG. 1.
Figure 3:
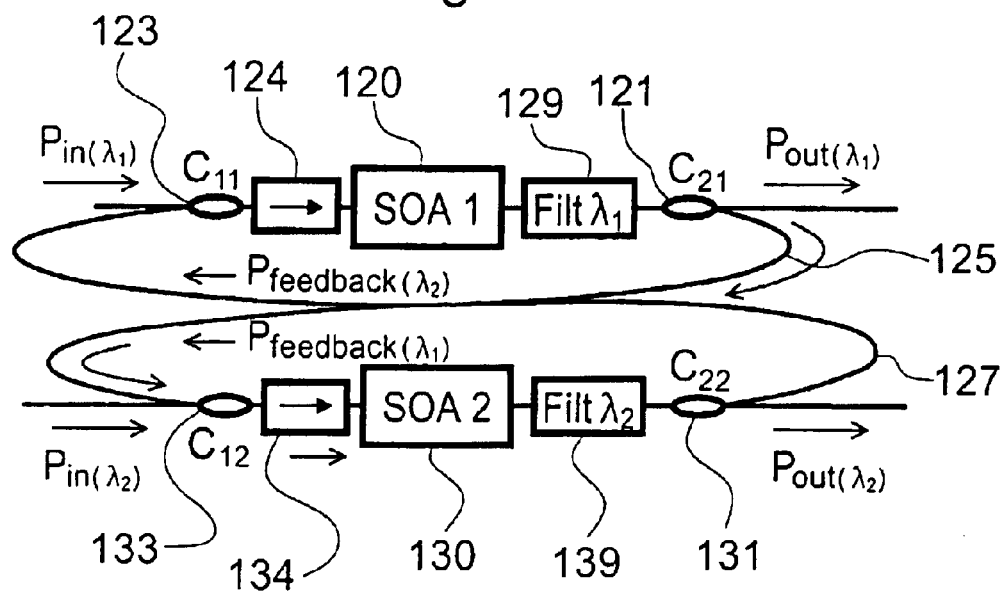
FIG. 3 shows a further prior art device which may be considered to be a waveguide development of the free-space device of FIG. 2.
Figure 4:
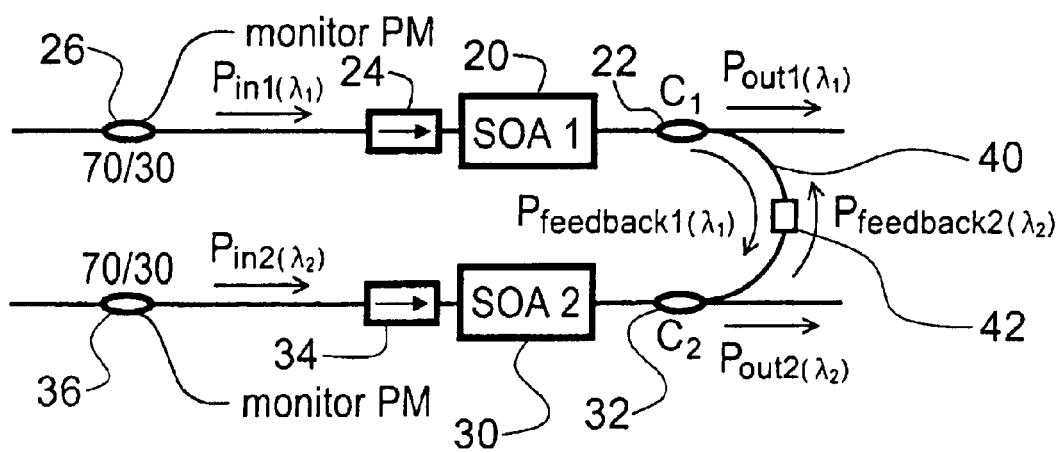
FIG. 4 shows an optical device according to the first embodiment of the invention.

FIG. 4 shows an optical device according to a first embodiment of the invention. The device comprises two amplifier elements arranged in a novel feedback configuration in which the feedback signal is fed into the amplifier in a reverse direction, which, by contrast to the prior art devices of FIGS. 2 and 3, has no electrical analogue.

The device comprises first and second gain media in the form of first and second semiconductor optical amplifiers (SOA's) 20 and 30 extending along respective optical axes. A first port of each SOA is arranged on the input side of the SOA to receive and inject a signal to be modulated through that SOA generally in a first direction along the optical axis. Each input signal has a power $P_{in}$ and propagates in the direction indicated by the accompanying arrows in the figure. A second port is arranged on the output side of each SOA to receive and output the signal after it has traversed and been modulated by the gain medium to reach a power $P_{out}$. The second port also serves to receive and inject a feedback optical control signal of power $P_{feedback}$ into that SOA in a second direction opposed to the first direction. The feedback optical control signal acts to vary the gain of the SOA experienced by the signal input from the first port.

More specifically, the first SOA (SOA 1) 20 has a first propagation path along which a first optical signal, input as signal $P_{in1}(\lambda_1)$, travels in a first forward direction. Similarly, the second SOA (SOA 2) 30 has a second propagation path along which a second optical signal input as $P_{in2}(\lambda_2)$ travels in a second forward direction.

A feedback path 40 is provided that interconnects the outputs of the first and second SOA's 20 and 30. As a result, a portion of the first optical signal output from the SOA 20 is supplied backwards into the output of the second SOA 30 as a feedback optical control signal $P_{feedback1}(\lambda_1)$. Also as a result, a portion of the second optical signal $P_{out2}(\lambda_2)$ output from the SOA 30 is supplied backwards into the output of the first SOA 20 as a feedback optical control signal $P_{feedback2}(\lambda_2)$. A single bi-directional feedback path shared by both feedback optical control signals is illustrated. This is an elegant solution, but separate feedback paths for the two feedback signals could also be provided if desired in which case isolators could be added.

The feedback signals are injected into the SOA's and travel backwards through them along the respective propagation paths in a reverse direction opposite to the forward propagation direction of the optical signals injected at the input side of the device. The reverse travelling feedback signals thus act as control signals for the forward travelling optical signals by virtue of the XGM effect. The feedback action is thus based on XGM into both SOA's as defined by the powers of the feedback signals $P_{feedback1}$ and $P_{feedback2}$.

On the output side of the first SOA 20, an optical coupler ($C_1$) 22 is arranged in the feedback path 40. The ratio of the coupler 22 defines the power ratio $P_{out1}(\lambda_1)$: $P_{feedback1}(\lambda_1)$ between the signal output from the first arm of the device and the signal fed back to the second SOA 30.

Similarly, on the output side of the second SOA 30, an optical coupler ($C_2$) 32 is arranged in the feedback path 40. The ratio of the coupler 32 defines the power ratio $P_{out2}(\lambda_2)$: $P_{feedback2}(\lambda_2)$ between the signal output from the second arm of the device and the signal fed back to the first SOA 20.

In a variant of the device, the coupler 32 (or 22) could be removed, or the output $P_{out2}(\lambda_2)$ (or $P_{out1}(\lambda_1)$) not utilized.

At the inputs of the SOA's 20 and 30 respective optical isolators 24 and 34 are inserted in order to filter out the feedback signals after traversal of the respective SOA's 20 and 30, thus to suppress parasitic oscillations due to back reflections.

In addition, two further couplers 26 and 36, each with a 70/30 coupling ratio, are placed before the device. These couplers were used in the prototype to monitor the input signals and are not part of the device itself.

The device also includes a filter 42 placed in the feedback path 40, namely between $C_1$ and $C_2$, to filter out the amplified spontaneous emission (ASE) originating from the SOA's. The SOA's ASE power otherwise alters signal gain compression efficiency. The filter bandwidth should include the two optical signals' wavelengths, or in the case that $\lambda_1=\lambda_2$ could be as narrow as possible to limit ASE effect. It will be understood that the filter 42, although advantageous, is optional and could be dispensed with.

In a specific example, the first SOA 20 is an Optospeed MRI/X −500. The second SOA 30 is an Alcatel M1008. Their outputs are connected by two fiber couplers, $C_1$ and $C_2$, which couple part of the output power of each SOA into the other. The couplers are 90/10 so that 90% of the output power of the first SOA 20 at $\lambda_1$ enters the second SOA 30 through coupler $C_2$. Similarly, 90% of the output power of the second SOA 30 at $X_2$ enters the first SOA 20 through coupler $C_1$. Thus, about 81% of the output power of the first SOA 20 is coupled into the second SOA 30 and vice versa to provide the feedback action. This choice of coupling ratio is a tradeoff between high feedback power and acceptable levels of output power, $P_{out1}$ and $P_{out2}$ The coupling ratio of the couplers $C_1$ and $C_2$ can be chosen as desired for the application concerned.

The circuit behavior can be described by the equation below, which expresses feedback action due to cross-gain compression:

$$P_{outi}(\lambda_i) = \frac{G_{0i}}{1+[P_{ini}(\lambda_i)+P_{inj}(\lambda_j)G_j(1-c_j)(1-c_i)]/P_{sat}} c_i P_{ini}(\lambda_i) \quad (1)$$

Where i,j are either 1 or 2, $G_{0i}$, is the $SOA_i$, unsaturated gain, $G_j$ is the $SOA_j$ gain, $P_{sat}$ is the input saturation power and $P_{in}(\lambda_i)$ $P_{out}(\lambda_i)$ are the circuit input and output powers respectively. $SOA_i$, is used here to refer to the $i^{th}$ SOA. In principle $\lambda_1$ and $\lambda_2$ could be the same wavelength which would not be possible in a co-propagating architecture. The counter-propagating XGM architecture of the device means that separation between signals is provided by the sense of propagation. Wavelength filtering is not needed.

The device has two main operating points according to the relative balance between the two input powers in the SOA's. In these two equilibrium states, the device outputs are complementary, i.e. the high level of $P_{out1}$ corresponds to the low level of $P_{out2}$ and vice versa. For a fixed value of $P_{in2}(\lambda_2)$, the high level equilibrium state of $P_{out2}(\lambda_2)$ is maintained as long as $P_{in1}(\lambda_1)$ is sufficiently low and $P_{out}(\lambda_1)$ and $P_{feedback1}(\lambda_1)$ are consequently low. Thus $SOA_2$ gain is not compressed and $P_{out2}(\lambda_2)$ is high. As $P_{feedback2}(\lambda_2)$ is greater than $SOA_1$ saturation power, it compresses $SOA_1$ gain thus keeping $P_{feedback1}(\lambda_1)$ low. On the other hand, when $P_{in1}(\lambda_1)$ grows, $P_{out1}(\lambda_1)$ and $P_{feedback1}(\lambda_1)$ grow too, till the gain of $SOA_2$ is compressed. Thus $P_{out2}(\lambda_2)$ moves to the low level equilibrium state. $P_{feedback2}(\lambda^2)$ does not compress the gain of $SOA_1$ any more, keeping $P_{feedback1}(\lambda_1)$ high.

With the above-described specific example, experiments have been performed using two different wavelengths at $\lambda_1=1551$ nm and $\lambda_2=1540$ nm. The bias current of both SOA's were fixed at their maximum values, namely 250 mA for $SOA_1$, and 200 mA for $SOA_2$. Simulation data shows that the best results are obtained when the amplifiers are operated at maximum bias current where XGM is more efficient. In this condition, operation as a threshold device was optimized.

Figure 5:
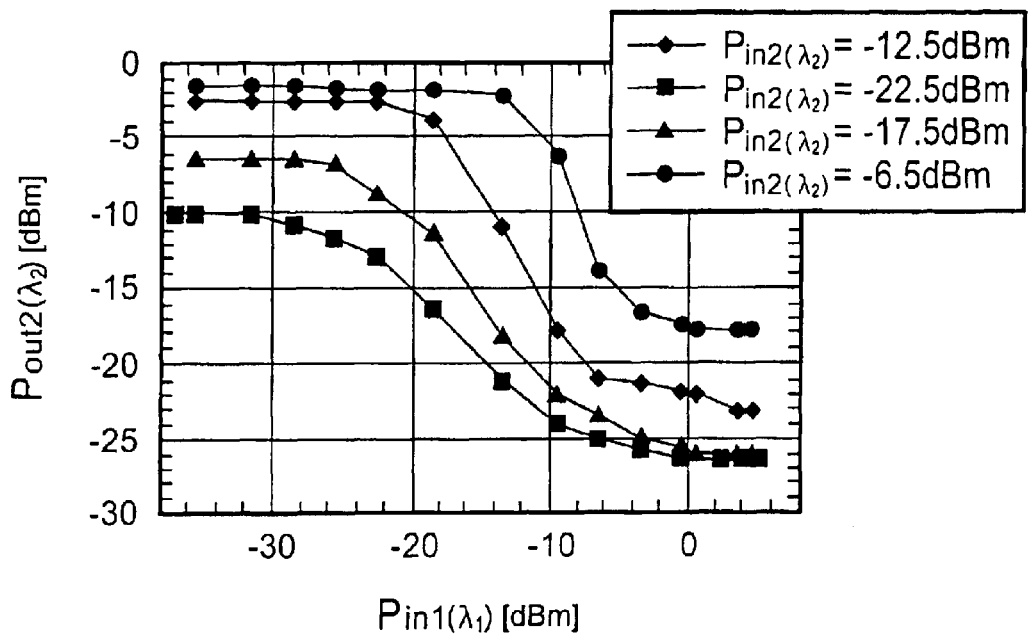
FIG. 5 shows response curves of the device of FIG. 4.

FIG. 5 shows experimental data of the response of the device of FIG. 4 in terms of a graph of output power $P_{out2}(\lambda_2)$ plotted versus $P_{in1}(\lambda_1)$ for four different values of $P_{in2}(\lambda_2)$ of =6.5 dBm, −12.5 dBm, −17.5 dBm and −22.5 dBm.

The threshold input is $P_{in1}$, which is varied to test the device, while $P_{in2}$ is fixed at each of four different values. The threshold output $P_{out2}$ is measured which is high when $P_{in1}$ is low, and switches to a low value when $P_{in1}$ is high. The behavior of the device has been further tested to compile the results shown in the table below which outlines the circuit performance in terms of output extinction ratio.

| $P_{in}(\lambda_2)$ [dBm] | Extinction Ratio [dB] |
| --- | --- |
| −32.5 | 15.44 |
| −29.5 | 15.35 |
| −22.5 | 16.35 |
| −17.5 | 19.73 |
| −12.5 | 20.68 |
| −6.5 | 16.24 |

Switching transient, switching power and extinction ratio values are conditioned by the SOA gain and $P_{in2}$. SOA gain is a function of operating wavelength, bias current and amplifying waveguide parameter.

Figure 6:
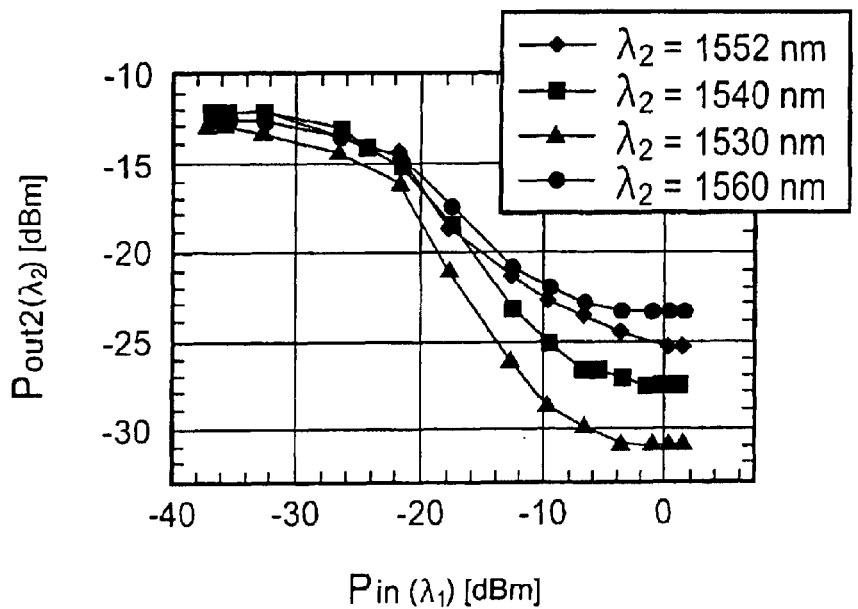
FIG. 6 shows further response curves of the device of FIG. 4.

FIG. 6 shows further response characteristics of the device of FIG. 4. A series of curves show the behavior of the device in terms of $P_{out2}(\lambda2)$ versus $P_{in1}(\lambda_1)$ as one of the input wavelengths $\lambda_2$ (and thus gain) is changed. Values of $\lambda_2$=1530, 1540, 1552 and 1560 nm were taken, all with $\lambda_1$=1551 nm and $P_{in2}(\lambda_2)$=29.5 dBm. From these results it is apparent that optimization of SOA gain as a function of signal wavelength allows performance (i.e. extinction ratio) to be improved.

The device of the first embodiment can operate both as a threshold circuit (when $P_{in2}$ is fixed) and as a comparator (when both $P_{in1}$ and $P_{in2}$ vary).

The response speed of the device is now considered. Two of the limiting factors for the speed of response are: (i) the inherent SOA XGM response which is well known to be less than 100 ps; and (ii) the physical propagation time of the feedback signal in the feedback path. The inherent SOA XGM response can thus be neglected, the response time being limited by the feedback path length.

An integrated fiber implementation of the device of the first embodiment should allow a feedback path of only a few centimeters, where the limiting length is not attributable to the SOA's (length of the order of 1 mm) but rather the integrated coupling circuit length, specifically the length of the feedback path 40. Even shorter feedback path lengths may be possible in integrated planar waveguide implementations. In fact, still shorter path lengths are possible in the devices of the second and third embodiments discussed further below.

Comparison of First Embodiment & Prior Art Device of Reference

A comparison between the prior art device of FIG. 3 and the first embodiment device of FIG. 4 is now made. A fundamental difference is that the device of FIG. 3 uses feedback conforming to an electrical circuit analogy in which the output of one SOA is fed back to the input of the other SOA and vice versa, whereas the device of FIG. 4 uses feedback that has no electrical circuit analogy in which the output of one SOA is fed into the output of the other SOA and vice versa.

The arrangement of FIG. 3 is referred to as a co-propagating configuration, because the optical signal to be modulated propagates in the same direction through the SOA as the controlling feedback signal. By contrast, the arrangement of FIG. 4 is referred to as a counter-propagating configuration, because the optical control signal fed into one SOA from the output of the other SOA is fed in backwards at the SOA output to propagate through the SOA in the reverse direction as compared to the optical signal to be modulated.

Comparison is now made between specific performance aspects of the co-propagating waveguide architecture of the embodiment of FIG. 4, on the one hand, and the prior art counter-propagating architecture of FIG. 3, on the other hand.

1. Integrability on a single chip: The counter-propagating solution of FIG. 4 can be implemented in a single plane and thus can be implemented easily in planar technology on a single chip. By contrast, in the co-propagating solution of FIG. 3, the two feedback paths intrinsically cross each other which would add complexity to an integrated device implementation based on planar waveguide technology.

2. Feedback path lengths: This issue is directly related to the issue of integratibility mentioned above, since the shortest paths will be obtainable for devices integrated on a single chip. In the devices of both FIG. 4 and FIG. 3, the minimum feedback path length will be defined by the minimum radius of curvature of the waveguide bends. The minimum radius of curvature depends on the adopted technology, i.e. silicon on silica from 5 mm to 1 cm, $LiNbO_3$>5 cm, InP or GaAs>100 um.

As can be seen from FIG. 4, the feedback path length for the counter-propagating configuration is much longer being the sum of:

(1) first coupler ($C_1$) arm;
(2) second coupler ($C_2$) arm; and
(3) SOA2 length, which is equal to $\pi/2$ radius_of_curvature+$\pi/2$ radius_of_curvature+1.5 mm=$\pi$ radius_of_curvature+1.5 mm ≈1.7 cm (assuming a 5 mm radius of curvature).

In the co-propagating configuration of FIG. 3 implemented with optical fiber waveguide connections, the feedback path includes the SOA1 pigtail, which cannot be shortened to less than 2–3 cm to allow fiber splicing, the two filter pigtails plus the filter itself (4–5 cm), coupler $C_{21}$, and its pigtails plus coupler $C_{12}$ pigtails (4–5 cm), the fiber connection between the two coupler (3 cm), the two isolator pigtails plus the isolator itself (3–4 cm), the SOA2 plus one of its pigtails (2 cm) which totals to a length of 18 cm, i.e. over an order of magnitude longer than for the device of FIG. 4.

The feedback time, i.e. the time needed by the feedback signal to travel along the feedback path, limits the maximum allowable bit rate. Consequently, the FIG. 3 device will have a feedback time of around 1 ns, the approximate time needed for propagation of 20 cm. By contrast, a feedback time of less than 100 ps can be obtained with the counter-propagating configuration of FIG. 4 integrated on a single chip.

3. Switching Power: Assuming that the SOA switching power (i.e. the power needed to obtain a suitable extinction ratio) in the two configurations is the same, in the co-propagating configuration of FIG. 3 the switching power which enters the SOA experiences the following losses: (1) Isolator 124/134; (2) Input coupler ($C_{12}$ for $P_{feedback}(\lambda_1)$ ); (3) Output coupler ($C_{21}$ for $P_{feedback}(\lambda_1)$ ); and (4) Filter 129/139. By contrast, in the counter-propagating configuration of FIG. 4, the switching power experiences only the loss of the two output couplers ($C_1$ and $C_2$).

In specific examples of the devices, the $C_1$ coupling ratio of the FIG. 4 device was 0.9, and the $C_{21}$ and $C_{12}$ coupling ratios of the FIG. 3 device were respectively 0.9 and 0.7. This leads to a loss difference of 1.1 dB in favor of the FIG. 4 device taking account only of the coupler losses. The FIG. 4 device would compare even more favorably, if isolator and filter losses were also taken into account.

4. Input losses: The input signals also experience different losses in the two configurations. In the counter-propagating configuration, the input signals enter the SOA's directly after the isolators 24/34. In the co-propagating configuration, the same isolator losses occur, but the input signals have the additional loss of the input coupler 123/133.

It will thus be appreciated that the first embodiment of the invention is superior to that of the prior art device of FIG. 3 in terms of integratibility, feedback time, switching power and input loss.

Second Embodiment

Figure 7:
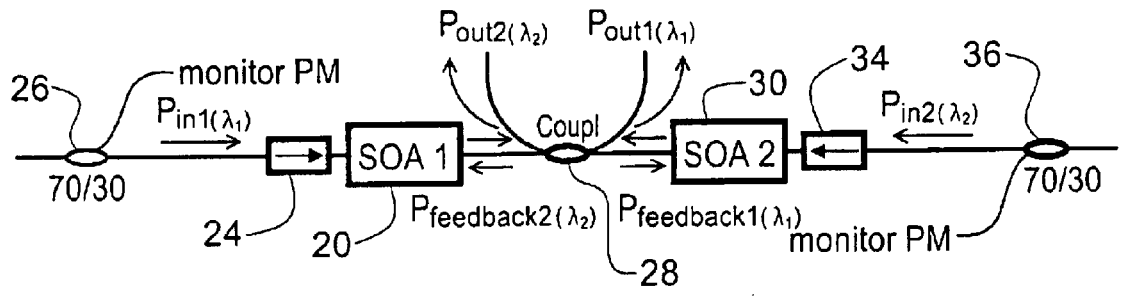
FIG. 7 shows an optical device according to a second embodiment of the invention.

FIG. 7 shows an optical device according to a second embodiment of the invention. The second embodiment will mainly be understood from the first embodiment of FIG. 4, the above description of which is referred to. In the following, the second embodiment is thus discussed in relation to its differences from the first embodiment.

The principal difference between the first and second embodiments is the replacement of the two three-way couplers 22 and 32 with one four-way coupler 28. This change is elegant in that a further component is eliminated, thus further reducing losses, as well as complexity and cost.

Third Embodiment

Figure 8:
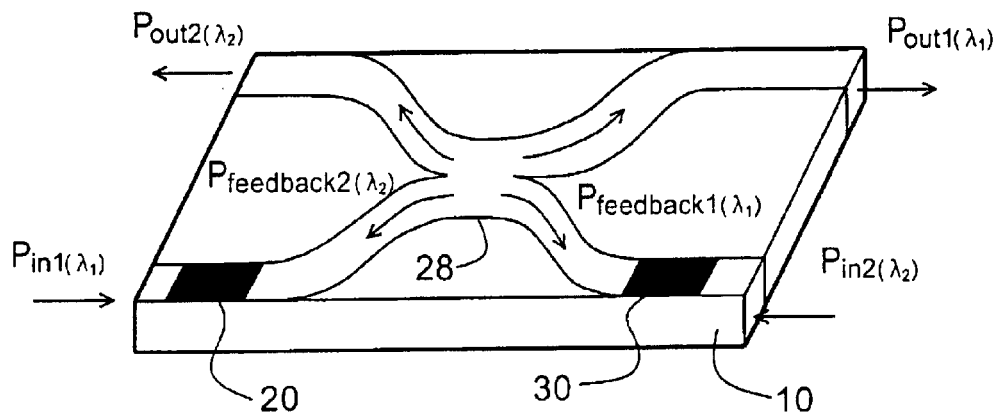
FIG. 8 shows an optical device according to a third embodiment of the invention.

FIG. 8 shows an optical device according to a third embodiment of the invention. The third embodiment may be considered to be a planar waveguide implementation of the second embodiment.

The device is based on an integrated bidirectional coupler 28, functionally equivalent to the four-way fiber coupler 28 of the second embodiment, and fabricated on a chip 10. Two SOA's 20 and 30 are deposited in waveguides leading to the coupler 28, functionally equivalent to the SOA's of the second embodiment. The device function will be understood in all other respects with reference to the second embodiment. Additional isolators (not shown) may also be provided, as in the second embodiment.

In the third embodiment, the two SOA's 20 and 30 are arranged facing each other with a feedback path that does not curve back on itself but. This contrasts to a planar waveguide implementation of the first embodiment of FIG. 4 in which the two SOA's 20 and 30 are arranged parallel to each other with a feedback path that would curve back on itself. The arrangement of the third embodiment has the advantage that the feedback path can be made still shorter, thus further reducing the propagation time of the feedback signal. In a planar waveguide implementation of the first embodiment, the feedback path length will be limited by the minimum radius of curvature for acceptable bending losses in the feedback path. In the third embodiment, this design limitation is removed. In a variant of the third embodiment, there could be a straight path between the two SOA's 20 and 30.

The outputs may bend to emerge from the chip parallel to the inputs, as illustrated in FIG. 8, so that all input and outputs are from the ends of the chip 10. Alternatively, the outputs from the (rectangular) chip may be lateral to the inputs. In other words, the outputs may come from the sides of the chip with the inputs at the ends. Other variations are also possible.

Fourth Embodiment

Figure 9:
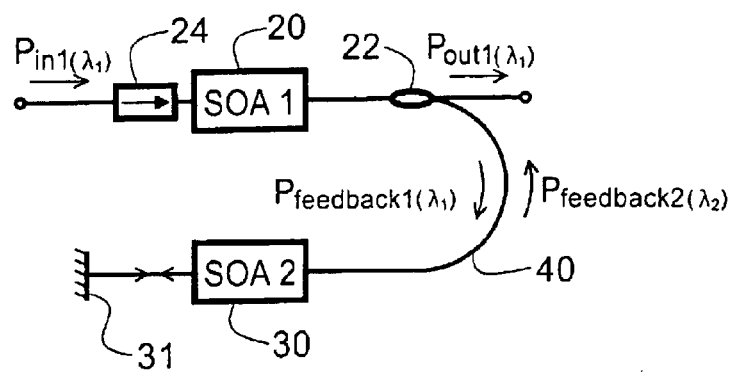
FIG. 9 shows an optical device according to a fourth embodiment of the invention.

FIG. 9 is a schematic diagram of a fourth embodiment of the invention, which may be considered to be a modification of the first embodiment and is specifically for performing threshold functions. The principal difference between the first and fourth embodiments is that, in the fourth embodiment, instead of input of a separate second input signal for the second gain medium 30, the second optical control signal $P_{feedback1}(\lambda_1)$ is reflected back into the second gain medium by a mirror 31. The reflected second optical control signal thus serves as the second optical signal $P_{in2}(\lambda_2)$.

An external comparison signal is thus dispensed with, the output $P_{out}(\lambda_1)$ being a function purely of the single input $P_{in1}(\lambda_1)$ to provide a threshold function. The value of the threshold can be set passively or dynamically through choice or control of the gain medium (SOA) and the reflectivity of the mirror 31.

In a fiber implementation, the mirror 31 may be implemented as a Bragg reflector. Alternatively, a dielectric mirror could be deposited on the end of an optical fiber. In a planar waveguide implementation, the mirror may be deposited on the cleaved edge of the waveguide chip, or may be internal to a planar waveguide.

All other components of the fourth embodiment shown in FIG. 9 will be understood with reference to the first embodiment of FIG. 4.

Reference

1. R. W. Gray et al "Optooptic modulation based on gain saturation" IEEE J. Quantum Electron. vol. 14, issue 11, pages 893–900 (1978).
2. P. Parolari et al "SOA based all-optical threshold" Proceedings CLEO 2000 pages 309–310 (2000)
3. M. T. Fatehi et al "Erbium-doped fiber amplifiers with wavelength-selective optical feedback" IEEE Photon. Technol. Lett. vol. 8, issue 8, pages 1012–1014 (1996).
4. A. J. Poustie et al "Temporal evolution of amplitude restoration and thresholding in an all-optical regenerative memory" Journ. of Modern Optics vol. 46, issue 8, pages 1251–1254 (1999).
5. G. Morthier et al "A novel optical decision circuit based on a Mach-Zehnder or Michelson interferometer and gain-clamped semiconductor optical amplifiers" IEEE Photon.Technol. Lett. vol. 10, issue 8, page 1162–1164 (1998).
6. G. Morthier et al "Experimental demonstration of an all-optical 2R regenerator with adjustable decision threshold" IEEE LEOS'99, page 902 (1999).
7. EP-A-0974888

What is claimed is:

1. An optical device comprising:
   (a) a first active medium having a first input port and a first output port arranged to define a first propagation path for traversal of a first optical signal in a first forward direction between the first input port and the first output port;
   (b) a second active medium having a second input port and a second output port arranged to define a second propagation path for traversal of a second optical signal in a second forward direction between the second input port and second output port; and
   (c) a feedback path connecting the first and second active media so as to route at least a portion of the first and second optical signals from the first and second output ports to the second and first output ports as respective second and first optical control signals for travel along the second and first propagation paths in second and first reverse directions that are opposite to the second and first forward directions respectively.

2. An optical device according to claim 1, wherein the first and second output ports face in the same direction.

3. An optical device according to claim 1, wherein the first and second active media are arranged with their first and second forward directions aligned.

4. An optical device according to claim 1, wherein the feedback path comprises a bend.

5. An optical device according to claim 1, wherein the first and second active media are arranged with their first and second forward directions opposed.

6. An optical device according to claim 1, wherein the first and second output ports face towards each other.

7. An optical device according to claim 1, wherein the feedback path is substantially straight.

8. An optical device according to claim 1, wherein the feedback path is a waveguide shared by the first and second optical control signals which propagate along the waveguide in opposite directions.

9. An optical device according to claim 1, comprising a first optical isolator arranged to filter out the first optical control signals after traversal of the first active medium in the first reverse direction.

10. An optical device according to claim 1, comprising a second optical isolator arranged to filter out the second optical control signal after traversal of the second active medium in the second reverse direction.

11. An optical device according to claim 1, comprising at least one multi-way optical element arranged in the feedback path so as to route a part of at least one of the first and second optical signals from the first and second output ports out of the feedback path for output from the device.

12. An optical device according to claim 1, wherein the first and second active media and the feedback path are integrated in a planar waveguide structure.

13. An optical device according to claim 1, wherein the first and second active media are discrete components and the feedback path comprises an optical fiber waveguide.

14. An optical device according to claim 1, wherein the first and second active media are gain media.

15. An optical device according to claim 1, wherein the first and second active media are lossy media.

16. An optical device according to claim 1, comprising a reflector arranged to reflect the second optical control signal back through the second active medium as the second optical signal.

17. A method of modulating an optical signal, comprising:
(a) providing first and second active media;
(b) supplying first and second optical signals to traverse the first and second active media in first and second forward directions; and
(c) routing at least a portion of the first and second optical signals, after traversing the first and second active media, to the second and first active media as second and first optical control signals respectively, wherein the first and second optical control signals are supplied through the first and second active media in first and second reverse directions opposed to the first and second forward directions so that the first and second optical control signals vary the modulation experienced by the first and second optical signals during their respective traverses of the first and second active media.

18. A method according to claim 17, wherein the second optical signal is substantially invariant, serving as a reference signal, and the method provides a threshold determination.

19. A method according to claim 17, wherein the first and second optical signals are variable, and the method provides a comparison function.

20. A method according to claim 17, wherein the first and second active media are gain media so that the first and second optical control signals vary the gain experienced by the first and second optical signals.

21. A method according to claim 17, wherein the first and second active media are lossy media so that the first and second optical control signals vary the attenuation experienced by the first and second optical signals.

* * * * *